United States Patent
Aptaker et al.

(10) Patent No.: US 9,312,092 B2
(45) Date of Patent: Apr. 12, 2016

(54) DEFLECTION PLATE AND DEFLECTION DEVICE FOR DEFLECTING CHARGED PARTICLES

(75) Inventors: Peter Simon Aptaker, Wantage (GB); Paul Beasley, Abingdon (GB); Oliver Heid, Erlangen (DE)

(73) Assignee: SIEMENS AKTIENGESELLSCHAFT (DE)

( * ) Notice: Subject to any disclaimer, the term of this patent is extended or adjusted under 35 U.S.C. 154(b) by 0 days.

(21) Appl. No.: 14/397,026

(22) PCT Filed: May 31, 2012

(86) PCT No.: PCT/EP2012/060279
§ 371 (c)(1),
(2), (4) Date: Nov. 20, 2014

(87) PCT Pub. No.: WO2013/178276
PCT Pub. Date: Dec. 5, 2013

(65) Prior Publication Data
US 2015/0123007 A1 May 7, 2015

(51) Int. Cl.
*G21K 5/04* (2006.01)
*H01J 37/147* (2006.01)
*H05H 7/00* (2006.01)

(52) U.S. Cl.
CPC ............... *H01J 37/147* (2013.01); *H05H 7/00* (2013.01); *H01J 2237/15* (2013.01); *H05H 2007/002* (2013.01)

(58) Field of Classification Search
USPC .............. 250/396 R, 397, 398, 396 ML
See application file for complete search history.

(56) References Cited

U.S. PATENT DOCUMENTS

| 7,812,319 B2 * | 10/2010 | Diehl et al. ............ 250/396 ML |
| 7,868,301 B2 * | 1/2011 | Diehl ............................ 250/398 |
| 2009/0206250 A1 * | 8/2009 | Wollnik ...................... 250/290 |
| 2012/0280121 A1 * | 11/2012 | Li ........................ H01J 49/405 |
| | | 250/287 |

FOREIGN PATENT DOCUMENTS

| JP | 2004527885 A | 9/2004 |
| JP | 2007513460 A | 5/2007 |
| JP | 2009507351 A | 2/2009 |
| JP | 2009507352 A | 2/2009 |
| JP | 2009532831 A | 9/2009 |

OTHER PUBLICATIONS

International Search Report for PCT Application No. PCT/EP2012/060279, International Filing Date: May 31, 2012; 2 pgs.
E.S. Masunov et al: "Space Charge Effects 1-11 and RF Focusing of Ribbon Beam in Ion Linac" "Problems of Atomic Science and Technology" 2001-No. 5.Series: Nuclear Physics Research (39), 2001, pp. 71-73.
J. Egberts et al: "Design and Test of the LIPAc IPM, Proceedings of BIW2012. Newport News, Virginia, USA, Nov. 2012.
(Continued)

*Primary Examiner* — Nicole Ippolito
(74) *Attorney, Agent, or Firm* — Schmeiser Olsen & Watts LLP

(57) ABSTRACT

A deflection plate having a non-planar shape, for deflecting charged particles is provided. An associated method is also provided.

5 Claims, 5 Drawing Sheets

(56) References Cited

OTHER PUBLICATIONS

O.A. Anderson et al: "A Transverse-field-focussing (TFF) Accelerator for intense Ribbon Beams", IEEE Transactions on Nuclear Science, vol. 30. No. 4. Aug. 1983, pp. 3215-3217.

M. Poggi et al: "two-dimensional ionization Beam Profile Measurement", Proceedingd of DIPAC09 Basel Switzerland, Sep. 2009. pp. 384-386.

* cited by examiner

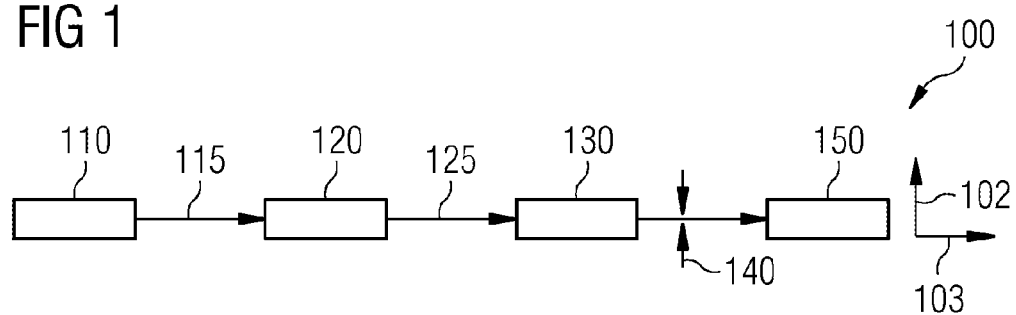
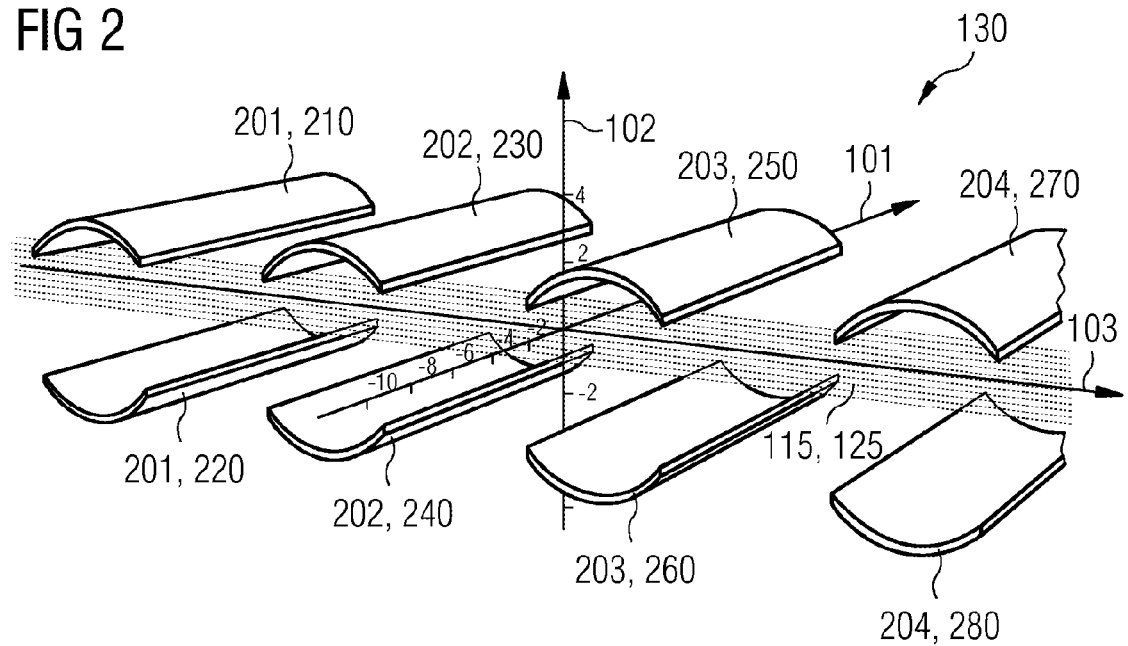

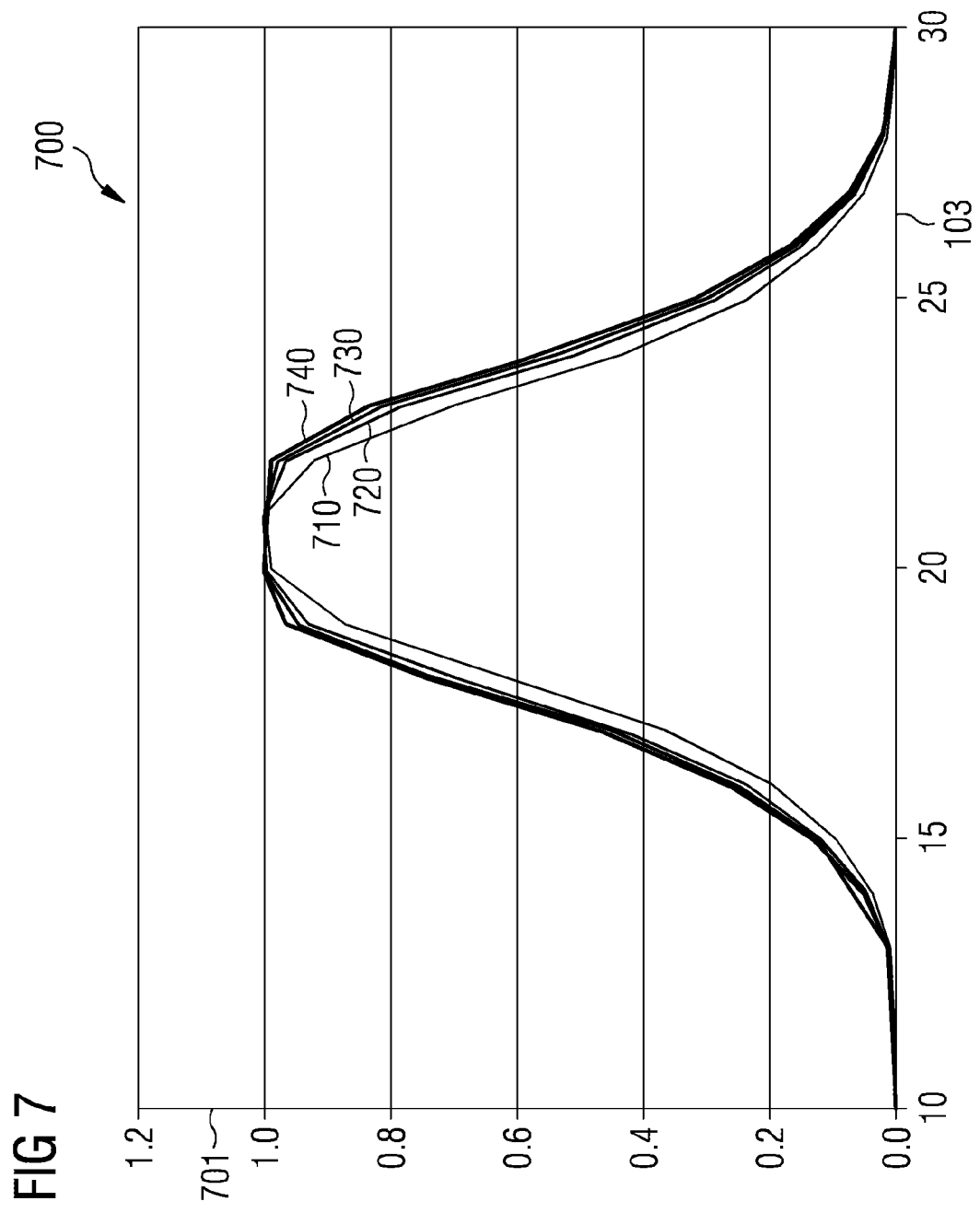

DEFLECTION PLATE AND DEFLECTION DEVICE FOR DEFLECTING CHARGED PARTICLES

CROSS-REFERENCE TO RELATED APPLICATION

This application claims priority to PCT Application No. PCT/EP2012/060279, having a filing date of May 31, 2012, the entire contents of which is hereby incorporated by reference.

FIELD OF TECHNOLOGY

The following relates to a deflection plate for deflecting charged particles, and a deflection device for deflecting charged particles.

BACKGROUND

The deflection of moving charged particles by electric and/or magnetic fields is known. The generation of electric fields by applying electric voltages to conductive plates is also known.

SUMMARY

An aspect relates to an improved deflection plate for deflecting charged particles. According to another aspect, embodiments of the invention include providing an improved deflection device for deflecting charged particles.

A deflection plate according to embodiments of the invention for deflecting charged particles has a non-planar shape. Advantageously, compared to a planar deflection plate, this deflection plate generates an electric field with an improved spatial profile.

In a preferred embodiment of the deflection plate, the latter is curved about an axis oriented in a first spatial direction. Then, a component, perpendicular to the first spatial direction, of an electric field generated by the deflection plate advantageously has a flatter profile in a further spatial direction perpendicular to the first spatial direction than is the case in a planar deflection plate. Advantageously, this simplifies the deflection of individual bunches of charged particles from a beam with a plurality of successive particle bunches.

In a particularly preferred embodiment of the deflection plate, the latter has an arced shape like a cylinder lateral surface. Advantageously, research has shown that an arced shape like a cylinder lateral surface generates a particularly advantageous profile of the electric field. A further advantage consists of it being relatively simple to produce a deflection plate with an arced shape like a cylinder lateral surface.

In an expedient embodiment of the deflection plate, the latter comprises a conductive material, more particularly a metal. Advantageously, the deflection plate can then be charged to an electric potential.

A deflection device according to embodiments of the invention for deflecting charged particles comprises a first deflection plate of the aforementioned type. Advantageously, this deflection device can be used for deflecting charged particles of a particle beam. As a result of the advantageously embodied deflection plate, the deflection device then can be used for selective deflection of individual particle bunches from a beam of successive bunches of charged particles.

In a preferred embodiment of the deflection device, the latter comprises a second deflection plate of the aforementioned type. Advantageously, a potential difference then can be generated between the deflection plates of the deflection device.

In a particularly preferred embodiment of the deflection device, the second deflection plate is disposed in a mirror-imaged manner in relation to the first deflection plate. Advantageously, a particularly expedient spatial profile of an electric field then emerges between the two deflection plates of the deflection device.

In a particularly preferred embodiment of the deflection device, the two deflection plates are respectively curved about an axis oriented in a first spatial direction. Here, the first deflection plate and the second deflection plate are spaced apart in a second spatial direction perpendicular to the first spatial direction. Moreover, the first deflection plate and the second deflection plate are disposed in a mirror-imaged manner in relation to a plane perpendicular to the second spatial direction. Advantageously, in the case of this deflection device, a component of an electric field pointing in the second spatial direction extends in a flat manner in a spatial direction perpendicular to the first spatial direction and to the second spatial direction.

Particularly preferably, the concave surfaces of the deflection plates face one another. Advantageously, the field profile of the component of the electric field pointing in the second spatial direction then is flat in a third spatial direction perpendicular to the first spatial direction and to the second spatial direction, without the deflection plates of the deflection device needing to have a great length in the third spatial direction.

In an additional development of the deflection device, the latter comprises a third deflection plate and a fourth deflection plate. Here, the third deflection plate is displaced in relation to the first deflection plate in a third spatial direction perpendicular to the first spatial direction and to the second spatial direction. Moreover, the fourth deflection plate is displaced in relation to the second deflection plate in the third spatial direction. Advantageously, a different potential difference can be applied between the third deflection plate and the fourth deflection plate than between the first deflection plate and the second deflection plate.

Preferably, the deflection device is embodied to deflect a charged particle moving in the third spatial direction into the second spatial direction. Advantageously, the deflection device can then be used to selectively deflect individual particles or bunches of particles from a particle beam.

BRIEF DESCRIPTION

Some of the embodiments will be described in detail, with reference to the following figures, wherein like designations denote like members, wherein:

FIG. 1 shows a schematic illustration of a particle therapy instrument;

FIG. 2 shows a schematic illustration of an embodiment of a deflection device;

FIG. 7 shows a second graph of the field strength profile within the plate pair.

DETAILED DESCRIPTION

Figure 3:
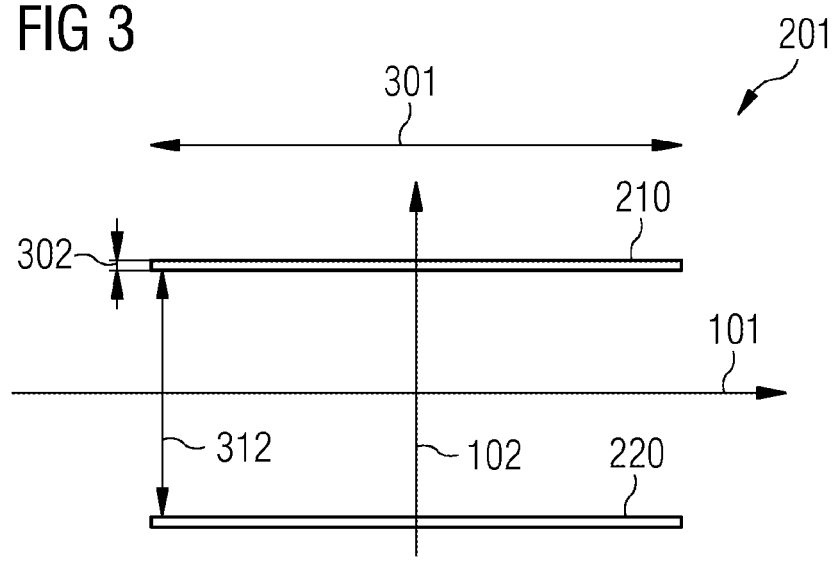
FIG. 3 show a first section through an embodiment of a plate pair of the deflection device.

FIG. 1 shows, in a schematic illustration, a particle therapy instrument 100 as an exemplary application for a deflection device. However, deflection devices can also be used in a multiplicity of other fields of application. Embodiments of the invention are by no means restricted to the field of particle therapy instruments.

The particle therapy instrument 100 can be used for performing particle therapy, in which a diseased body part of a patient is bombarded with charged particles. By way of example, the charged particles can be protons. By way of example, the disease of the patient can be a tumor.

The particle therapy instrument 100 comprises an ion source 110, a bunching device 120, a deflection device 130, a stop 140 and a particle accelerator 150, which are disposed in succession in a z-direction 103. The ion source 110 serves for generating a beam 115 of charged particles. By way of example, the particles of the particle beam 115 can be protons. The particles of the particle beam 115 leave the ion source 110 in the z-direction 103. By way of example, when leaving the ion source 110, the particles of the particle beam 115 can have an energy of 10 keV to 20 keV.

The bunching device 120 serves for subdividing the continuous particle beam 115 into discrete particle bunches 125. The particle bunches 125 leave the bunching device 120 in the z-direction 103. The bunching device 120 can also be dispensed with.

The deflection device 130 serves to selectively deflect individual particle bunches 125 (or individual particles from the continuous particle beam 115) in relation to the movement thereof extending in the z-direction 103 in a y-direction 102 perpendicular to the z-direction 103.

Particles and particle bunches 125 deflected by the deflection device 130 do not, or do not completely, pass the stop 140 which follows the deflection device 130, while the non-deflected particles and particle bunches 125 pass the stop 140. In alternative embodiments of the particle therapy instrument 100, only particles and particle bunches 125 deflected in the y-direction 102 by the deflection device 130 completely pass the stop 140.

Particles and particle bunches 125, which pass the stop 140, reach the particle accelerator 150, where they are accelerated to a higher kinetic energy of e.g. 80 MeV to 250 MeV. By way of example, the particle accelerator 150 can be a linear accelerator. In particular, the particle accelerator 150 can be an RF linear accelerator.

FIG. 2 shows a schematic illustration of the deflection device 130. In the embodiment shown in FIG. 2, the deflection device 130 comprises eight deflection plates for deflecting the particle bunches 125 of charged particles. In detail, the deflection device 130 in the shown embodiment comprises a first deflection plate 210, a second deflection plate 220, a third deflection plate 230, a fourth deflection plate 240, a fifth deflection plate 250, a sixth deflection plate 260, a seventh deflection plate 270 and an eight deflection plate 280.

The first deflection plate 210 and the second deflection plate 220 form a first plate pair 201. The third deflection plate 230 and the fourth deflection plate 240 form a second plate pair 202. The fifth deflection plate 250 and the sixth deflection plate 260 form a third plate pair 203. The seventh deflection plate 270 and the eighth deflection plate 280 form a fourth plate pair 204. In other embodiments, the deflection device 130 may also comprise fewer than four plate pairs 201, 202, 203, 204 or more than four plate pairs 201, 202, 203, 204.

The plate pairs 201, 202, 203, 204 are disposed in succession in the z-direction 103. The two respective deflection plates of each plate pair 201, 202, 203, 204 are situated at a respectively common position in the z-direction 103 and in an x-direction 101 perpendicular to the y-direction 102 and to the z-direction 103, and are spaced apart in the y-direction 102. The particle bunches 125 pass between the two respective deflection plates of the plate pairs 201, 202, 203, 204 in the z-direction 103.

The deflection plates 210, 220, 230, 240, 250, 260, 270, 280 consist of an electrically conductive material, preferably a metal, or at least comprise an electrically conductive material, for example in the form of a coating.

A potential difference, and hence an electric field, can respectively be generated between the deflection plates of the plate pairs 201, 202, 203, 204 in order to deflect the particles of the particle bunches 125 moving in the z-direction 103 in the y-direction 102. By way of example, a positive voltage could be applied to the first deflection plate 210 of the first plate pair 201 and a negative voltage with the same magnitude could be applied to the second deflection plate 220 of the first plate pair 201. The potential differences generated in the various plate pairs 201, 202, 203, 204 can differ from one another. In order only to deflect individual particle bunches 125 of the particle bunches 125 following one another in quick time succession into the y-direction 102, it is necessary to apply short-term voltage pulses to the deflection plates 210, 220, 230, 240, 250, 260, 270, 280.

A component pointing in the y-direction 102 of an electric field generated in a plate pair 201, 202, 203, 204 has a Gaussian profile in the z-direction 103 if the deflection plates 210, 220, 230, 240, 250, 260, 270, 280 are embodied as plane plates. However, it is more expedient if the profile of the component of the electric field pointing in the y-direction 102 has an approximate rectangle function in the z-direction 103 within a plate pair 201, 202, 203, 204. In order to approximate this preferred spatial profile of the component of the electric field pointing in the y-direction 102, the deflection plates 210, 220, 230, 240, 250, 260, 270, 280 of the deflection device 130 in each case have a non-planar geometry. This will be explained below on the basis of FIGS. 3 to 5, which show representations of the first plate pair 201. The remaining plate pairs 202, 203, 204 preferably have an identical design to that of the first plate pair 201.

FIG. 3 shows a first section through the first plate pair 201. Here, the section extends perpendicular to the z-direction 103. The first deflection plate 210 and the second deflection plate 220 of the first plate pair 201 have a width 301 in the x-direction 101. By way of example, the width 301 can be 4 mm. The deflection plates 210, 220 respectively have a thickness 302 in the y-direction 102. By way of example, the thickness 302 can be 0.1 mm. In the y-direction 102, the first deflection plate 210 and the second deflection plate 220 have a distance 312 from one another. By way of example, the distance 312 can be 6 mm.

Figure 4:
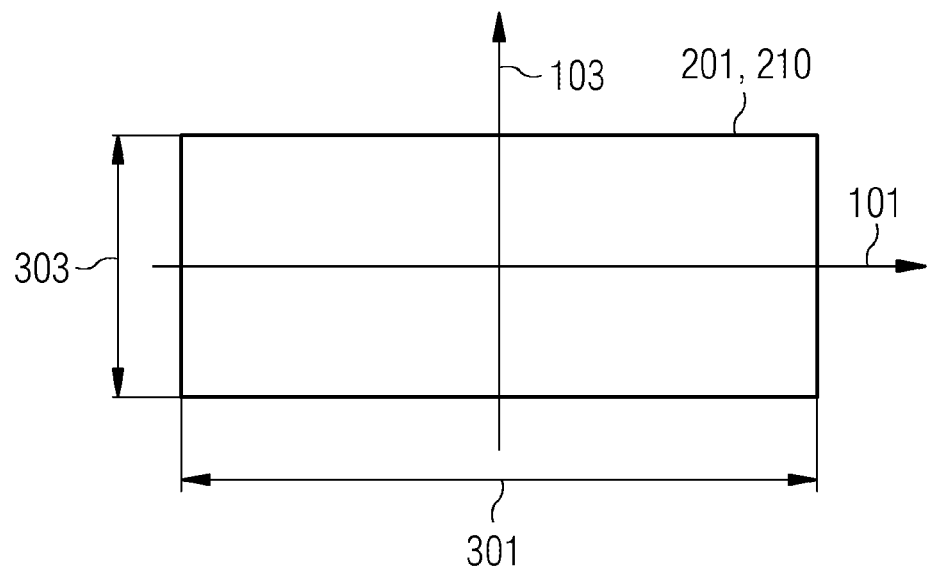
FIG. 4 shows a top view of an embodiment of the plate pair of the deflection device.

FIG. 4 shows a top view of the first deflection plate 210 of the first plate pair 201 in a viewing direction opposing the y-direction 102. The first deflection plate 210 has a length 303 in the z-direction 103, which may be e.g. 4 mm. The second deflection plate 220 of the first plate pair 201 preferably has the same length 303 in the z-direction 103 as the first deflection plate 210.

Figure 5:
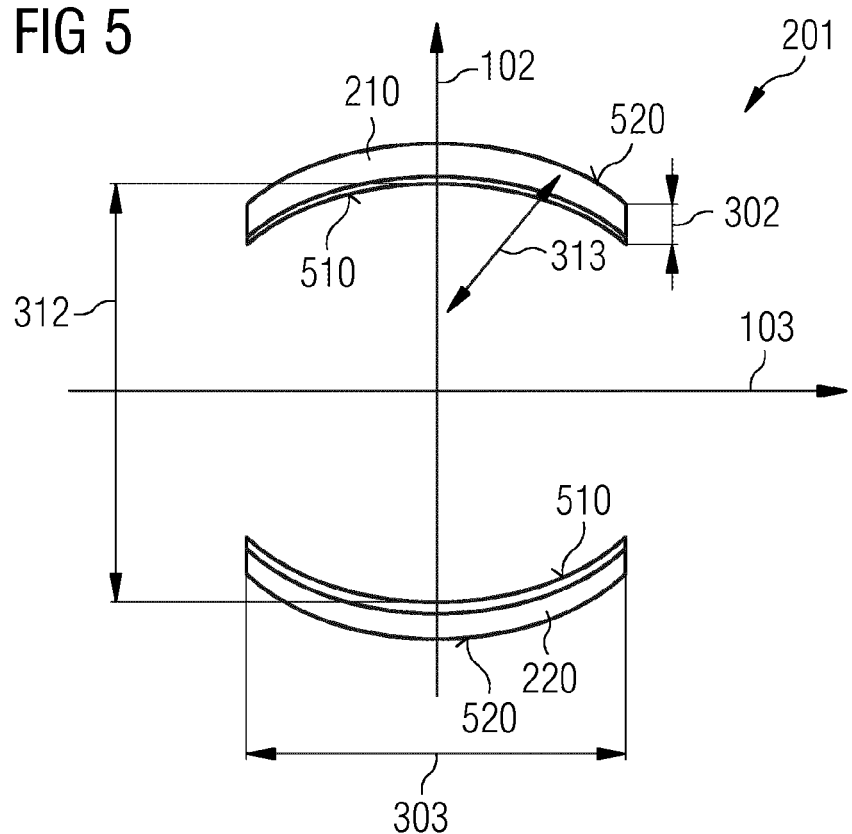
FIG. 5 shows a second section through an embodiment of the plate pair of the deflection device.

FIG. 5 shows a second section through the deflection plates 210, 220 of the first plate pair 201. In FIG. 5, the section is perpendicular to the x-direction 101. Each one of the deflection plates 210, 220 is curved about an axis parallel to the x-direction 101. Here, the curvature preferably follows a circular arc, such that the deflection plates 210, 220 have a design that is arc shaped like a cylinder lateral surface. Here, the deflection plates 210, 220 each have a radius of curvature 313. By way of example, the radius of curvature 313 may lie between 1 mm and 4 mm. The curved deflection plates 210, 220 each have a concave surface 510 and a convex surface 520. The concave surfaces 510 of the deflection plates 210, 220 face one another.

Figure 6:
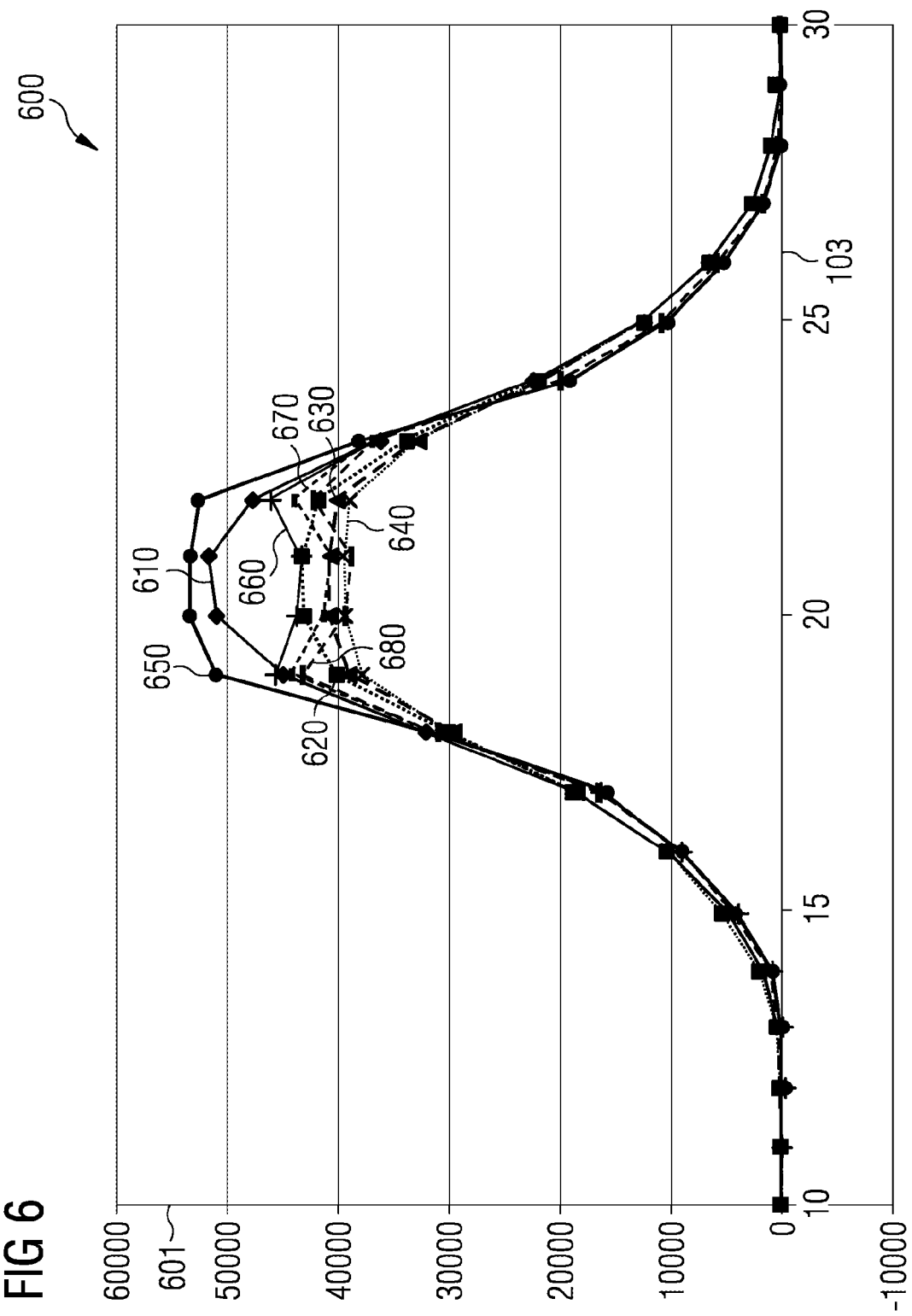
FIG. 6 shows a first graph of a field strength profile within the plate pair.

FIG. 6 shows, in a first graph 600, spatial field strength profiles which emerge in the case of different radii of curvature 313 of the deflection plates 210, 220, 230, 240, 250, 260, 270, 280. The z-direction 103 in the region of a plate pair 201, 202, 203, 204 is plotted on a horizontal axis of the first graph 600. A component 601 of an electric field strength pointing in the y-direction 102 is plotted on a vertical axis of the first graph 600.

A first field profile 610 specifies the profile of the electric field strength in the y-direction 102 in the case of a very large radius of curvature 313 of 1000 mm, which is selected in an exemplary manner. Such a large radius of curvature 313 constitutes an approximation to planar deflection plates 210, 220, 230, 240, 250, 260, 270, 280. The first field profile 610 therefore approximately specifies a field profile which emerges in the case of using planar deflection plates 210, 220, 230, 240, 250, 260, 270, 280. A second field profile 620 specifies the profile of the field component pointing in the y-direction 102 when using a radius of curvature 313 of 4 mm. A third field profile 630 specifies the profile of the field strength when using a radius of curvature 313 of 3 mm. A fourth field profile 640 specifies the profile of the component of the electric field pointing in the y-direction 102 when using a radius of curvature of 2.5 mm. The field profiles 610, 620, 630, 640 are in this case specified in each case at a position situated in the center in the y-direction 102 between the deflection plates of the plate pairs 201, 202, 203, 204. What can be identified is that the profile of the field strength 601 the y-direction 102 becomes increasingly rectangular, as a smaller radius of curvature 313 is selected, i.e. as the deflection plates 210, 220, 230, 240, 250, 260, 270, 280 are curved more strongly. The first graph 600 in FIG. 6 moreover depicts a fifth field profile 650, a sixth field profile 660, a seventh field profile 670 and an eighth field profile 680. The fifth field profile 650 emerges when using a radius of curvature 313 of 1000 mm. The sixth field profile 660 emerges when using a radius of curvature 313 of 4 mm. The seventh field profile 670 emerges when using a radius of curvature 313 of 3 mm. The eighth field profile 680 emerges when using a radius of curvature 313 of 2.5 mm. The field profiles 650, 660, 670, 680 in each case emerge at a position in the y-direction 102 which is not situated precisely between the two plates of the respective plate pair 201, 202, 203, 204, but which is disposed closer to one of the plates of the respective plate pair 201, 202, 203, 204. What can be identified is that each one of the field profiles 650, 660, 670, 680 has a convex embodiment in the z-direction 103 in the region around the center of the plate pair 201, 202, 203, 204. The convexity in this case increases as the radius of curvature 313 is selected to be smaller. Since such a convexity of the profile of the component pointing in the y-direction 102 of the electric field in the z-direction 103 may be connected with disadvantages, the radius of curvature 313 should not be selected to be too small.

FIG. 7 shows a second graph 700 of the profile of the component pointing in the y-direction 102 of the electric field along the z-direction 103. Once again, the z-direction 103 in the region of a plate pair 201, 202, 203, 204 is plotted on the horizontal axis of the second graph 700. A normalized field strength 701 of a component of the electric field pointing in the y-direction 102 is plotted on a vertical axis of the second graph 700. A first field profile 710, a second field profile 720, a third field profile 730 and a fourth field profile 740 specify the profile of the component pointing the y-direction 102 of the electric field along the z-direction 103 in the center between the two deflection plates of the respective plate pair 201, 202, 203, 204. Here, the radius of curvature 313 is 1000 mm in the first field profile 710, 4 mm in the second field profile 720, 3 mm in the third field profile 730 and 2.5 mm in the fourth field profile 740. It can be seen even more clearly from the normalized representation of the second graph 700 that the profile of the component of the electric field pointing in the y-direction 102 becomes ever more rectangular in the z-direction 103, the smaller the radius of curvature 313 of the deflection plates 210, 220, 230, 240, 250, 260, 270, 280 is selected to be.

Although the invention was illustrated and described in detail by the preferred exemplary embodiments, the invention is not restricted by the disclosed examples. Other variations can be derived therefrom by a person skilled in the art, without departing from the scope of protection of the invention.

The invention claimed is:

1. A deflection device for deflecting charged particles, wherein the deflection device is configured to deflect a charged particle, which is moving in a third spatial direction, in a second spatial direction, the deflection device comprising:
   a first deflection plate; and
   a second deflection plate;
   wherein the first deflection plate and the second deflection plate have a non-planar shape, and are both curved about an axis oriented in a first spatial direction;
   wherein the second deflection plate is disposed in a mirror-imaged manner in relation to the first deflection plate;
   wherein the first spatial direction, the second spatial direction, and the third spatial direction are perpendicular to each other.

2. The deflection device as claimed in claim 1, wherein at least one of the first deflection plate and the second deflection plate has an arced shape, the arced shape forming a cylinder lateral surface of the first deflection plate or the second deflection plate.

3. The deflection device as claimed in claim 1, wherein at least one of the first deflection plate and the second deflection plate includes a conductive material, the conductive material being a metal.

4. The deflection device as claimed in claim 1, wherein the deflection device deflects a charged particle moving in the third spatial direction into the second spatial direction.

5. The deflection device as claimed in claim 1, wherein the second deflection plate disposed in the mirror-imaged manner in relation to the first deflection plate such that the first deflection plate and the second deflection plate are aligned with respect to third spatial direction.

* * * * *

UNITED STATES PATENT AND TRADEMARK OFFICE
CERTIFICATE OF CORRECTION

PATENT NO. : 9,312,092 B2  
APPLICATION NO. : 14/397026  
DATED : April 12, 2016  
INVENTOR(S) : Peter Simon Aptaker et al.

Page 1 of 1

It is certified that error appears in the above-identified patent and that said Letters Patent is hereby corrected as shown below:

Title Page 2, References Cited, Column 1, line 1 please change "focussing" to --focusing--

Title Page 2, References Cited, Column 2, line 2 please change "Proceedingd" to --Proceedings--

Signed and Sealed this
Fifth Day of July, 2016

Michelle K. Lee
*Director of the United States Patent and Trademark Office*